United States Patent
Kim et al.

(10) Patent No.: US 10,199,594 B2
(45) Date of Patent: Feb. 5, 2019

(54) ORGANIC LIGHT EMITTING DISPLAY DEVICE

(71) Applicant: LG Display Co., Ltd., Seoul (KR)

(72) Inventors: Hyunsuk Kim, Paju-si (KR); SungHoon Choi, Daegu (KR); SungJi Yoon, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/361,282

(22) Filed: Nov. 25, 2016

(65) Prior Publication Data

US 2017/0155073 A1    Jun. 1, 2017

(30) Foreign Application Priority Data

Nov. 30, 2015 (KR) .......................... 10-2015-0169549

(51) Int. Cl.
| | |
|---|---|
| *H01L 51/50* | (2006.01) |
| *H01L 51/56* | (2006.01) |
| *H01L 51/52* | (2006.01) |
| *H01L 27/32* | (2006.01) |

(52) U.S. Cl.
CPC ...... *H01L 51/5056* (2013.01); *H01L 27/3211* (2013.01); *H01L 27/3246* (2013.01); *H01L 51/5036* (2013.01); *H01L 51/5064* (2013.01); *H01L 51/5072* (2013.01); *H01L 51/5218* (2013.01); *H01L 51/5234* (2013.01); *H01L 51/5265* (2013.01); *H01L 51/56* (2013.01); *H01L 2227/323* (2013.01); *H01L 2251/5315* (2013.01); *H01L 2251/558* (2013.01)

(58) Field of Classification Search
None
See application file for complete search history.

(56) References Cited

U.S. PATENT DOCUMENTS

| | | | |
|---|---|---|---|
| 9,147,714 B2 * | 9/2015 | Kashiwabara | H01L 27/3211 |
| 9,276,228 B2 * | 3/2016 | Seo | H01L 51/5016 |
| 9,324,963 B2 * | 4/2016 | Kim | H01L 51/5064 |
| 2005/0280355 A1 * | 12/2005 | Lee | H01L 27/3211 313/503 |
| 2006/0017377 A1 | 1/2006 | Ryu | |

(Continued)

FOREIGN PATENT DOCUMENTS

| | | |
|---|---|---|
| CN | 1725921 A | 1/2006 |
| CN | 104538559 A | 4/2015 |
| CN | 104752486 A | 7/2015 |

*Primary Examiner* — Telly D Green
(74) *Attorney, Agent, or Firm* — Birch, Stewart, Kolasch & Birch, LLP

(57) ABSTRACT

An organic light emitting display device according to an embodiment includes: a first anode electrode, a second anode electrode, and a third anode electrode, each anode electrode being spaced apart from each other; a bank disposed on edges of the first to third anode electrodes; a third hole transporting layer disposed on the first to third anode electrodes and the bank, and having a third hole mobility; a first hole transporting layer disposed on the third hole transporting layer and having a first hole mobility higher than the third hole mobility; and a second hole transporting layer disposed next to the first hole transporting layer on the third hole transporting layer and having a second hole mobility higher than the third hole mobility.

20 Claims, 5 Drawing Sheets

(56) References Cited

U.S. PATENT DOCUMENTS

| | | | |
|---|---|---|---|
| 2007/0296334 A1* | 12/2007 | Matsuda | H01L 27/3211 313/506 |
| 2013/0140533 A1* | 6/2013 | Lee | H01L 51/5265 257/40 |
| 2013/0234121 A1* | 9/2013 | Sonoyama | H01L 51/5012 257/40 |
| 2015/0115231 A1 | 4/2015 | Lee et al. | |
| 2015/0187848 A1 | 7/2015 | Kim | |
| 2015/0188075 A1* | 7/2015 | Kim | H01L 51/5064 257/40 |
| 2017/0373276 A1 | 12/2017 | Liu et al. | |

* cited by examiner

|  | Red | | Green | | Blue | |
| --- | --- | --- | --- | --- | --- | --- |
|  | V | cd/A | V | cd/A | V | cd/A |
| COMPARATIVE EXAMPLE | 4.5 | 54.2 | 3.4 | 124.0 | 4.2 | 5.6 |
| EMBODIMENT | 4.6 | 52.4 | 3.5 | 128.9 | 4.4 | 5.4 |

FIG. 3

ORGANIC LIGHT EMITTING DISPLAY DEVICE

CROSS-REFERENCE TO RELATED APPLICATIONS

This application claims priority from and the benefit under 35 U.S.C. § 119(a) of Korean Patent Application No. 10-2015-0169549, filed on Nov. 30, 2015, in the Korean Intellectual Property Office, the disclosure of which is incorporated herein by reference in its entirety for all purpose as if fully set forth herein.

BACKGROUND

Technical Field

The present disclosure relates to an organic light emitting display device, and more particularly, to an organic light emitting display device capable of reducing a color-coordinate shift due to changes in temperature by controlling a hole mobility of a hole transporting layer in the organic light emitting display device.

Description of the Related Art

Recently, a light emitting display device excellent in luminous efficiency, brightness, and viewing angle with a high response speed has attracted a lot of attention. A liquid crystal display device has been widely used so far as a display device. However, the liquid crystal display device requires a backlight as a separate light source and has a technical limitation in terms of brightness, contrast, viewing angle, and the like.

Recently, an organic light emitting display device which is self-emitting and thus does not require a separate light source but is relatively excellent in brightness, contrast, viewing angle, and the like has been developed.

Each sub-pixel of the organic light emitting display device includes an organic light emitting diode (OLED), a thin film transistor that drives the OLED, and a capacitor that stores an image signal. In the organic light emitting display device, sub-pixels are disposed in a matrix to display an image.

The sub-pixels of the organic light emitting display device include a red sub-pixel, a green sub-pixel, and a blue sub-pixel capable of displaying three primary colors.

The red sub-pixel includes a red OLED, and is connected to a capacitor and a driving transistor that drives the red OLED. The green sub-pixel includes a green OLED, and is connected to a capacitor and a driving transistor that drives the green OLED. The blue sub-pixel includes a blue OLED, and is connected to a capacitor and a driving transistor that drives the blue OLED.

The red OLED includes a first anode electrode, a hole transporting layer, a red organic emission layer, a cathode electrode, and a capping layer. The green OLED includes a second anode electrode, a hole transporting layer, a green organic emission layer, a cathode layer, and a capping layer. The blue OLED includes a third anode electrode, a hole transporting layer, a blue organic emission layer, a cathode layer, and a capping layer.

The OLEDs are highly vulnerable to oxygen, hydrogen, and moisture. Therefore, the OLEDs are sealed by an encapsulation layer that protects the OLEDs against oxygen, hydrogen, and moisture.

SUMMARY

The inventors of the present disclosure researched and developed an OLED structure to solve the problem that the white balance of a white light from an organic light emitting display device varies according to the ambient temperature.

The inventors of the present disclosure recognized that if a hole transporting layer is formed as a common layer and deposited on the entire display area of the organic light emitting display device, a lateral current phenomenon may occur. The lateral current phenomenon refers to a phenomenon that an unwanted current is supplied from one OLED to another adjacent OLED and the another adjacent OLED is turned on. In particular, the lateral current phenomenon may be easily observed when an image signal having a low gray level, for example, a gray level of 31 or less on an 8 bit basis, is applied.

The inventors of the present disclosure considered that the hole transporting layer formed as a common layer is a lateral current path. Further, the inventors of the present disclosure recognized that the amount of lateral current flowing through the hole transporting layer may vary depending on a temperature. Specifically, it is confirmed that as the temperature is increased, the amount of lateral current is increased and a white balance of a white light tends to be close to red. Further, it is confirmed that as the temperature is decreased, the amount of lateral current is decreased and a white balance of a white light tends to be close to blue.

The inventors of the present disclosure recognized that the amount of lateral current is in proportion to a hole mobility ($m^2V^{-1}s^{-1}$) of the hole transporting layer. That is, the inventors of the present disclosure recognized that an electrical resistance value of the hole transporting layer varies depending on a temperature and the amount of lateral current varies depending on a temperature.

Accordingly, an object to be achieved by the present disclosure is to provide an organic light emitting display device including a hole transporting layer capable of reducing a color-coordinate difference ($\Delta u'v'$) of a white balance of a white light depending on a temperature.

In addition to the above-mentioned objects of the present disclosure, other features and advantages of the present disclosure will be described below, or will be clearly understood by those of ordinary skill in the art from descriptions below.

According to an aspect of the present disclosure, there is provided an organic light emitting display device. The organic light emitting display device includes: a first anode electrode, a second anode electrode, and a third anode electrode, each anode electrode being laterally spaced apart from each other; a bank disposed on edges of the first anode electrode, the second anode electrode, and the third anode electrode; a third hole transporting layer disposed on the first to third anode electrodes and the bank, and having a third hole mobility; a first hole transporting layer disposed on the third hole transporting layer and having a first hole mobility higher than the third hole mobility; and a second hole transporting layer disposed next to the first hole transporting layer on the third hole transporting layer and having a second hole mobility higher than the third hole mobility.

Details of the exemplary embodiments will be included in the detailed description and the accompanying drawings.

According to the present disclosure, an organic light emitting display device reduces a hole mobility of a hole transporting layer and thus reduces a white balance difference ($\Delta u'v'$) of a white light depending on a temperature.

The effects of the present disclosure are not limited to the aforementioned effects, and various other effects are included in the present specification. Further scope of applicability of the present invention will become apparent from the detailed description given hereinafter. However, the detailed description and specific examples, while indicating preferred embodiments of the invention, are given by illustration only, since various changes and modifications within the spirit and scope of the invention will become apparent to those skilled in the art from this detailed description.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings:

FIG. 3 is a table comparing an organic light emitting display device according to an exemplary embodiment of the present disclosure with Comparative Example;

DETAILED DESCRIPTION OF THE EMBODIMENTS

Figure 1:
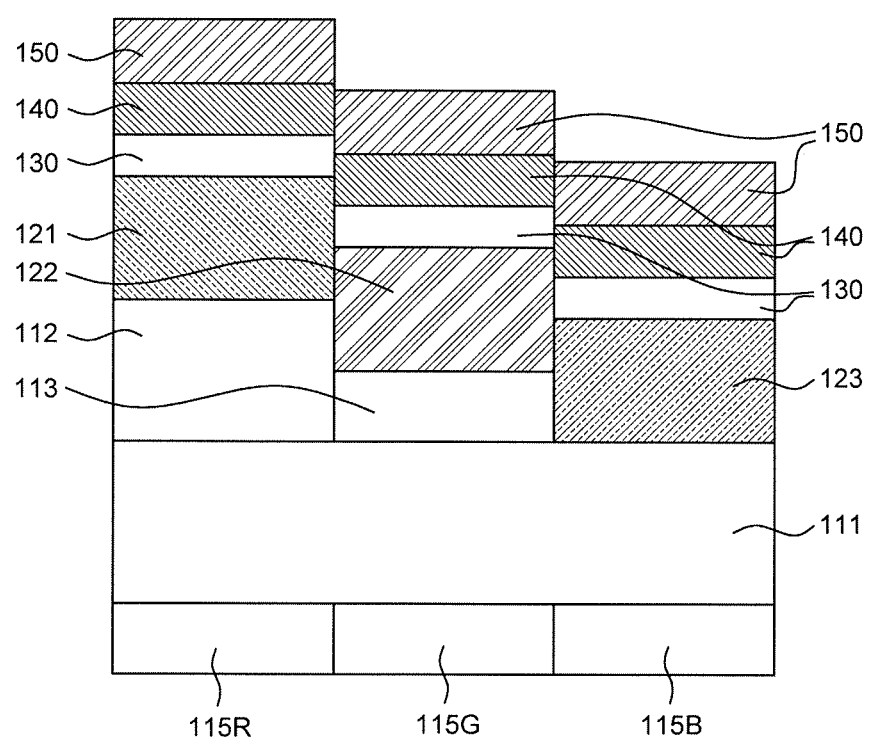
FIG. 1 is a diagram schematically illustrating an organic light emitting display device according to an exemplary embodiment of the present disclosure.

Advantages and features of the present disclosure, and methods for accomplishing the same will be more clearly understood from exemplary embodiments described below with reference to the accompanying drawings. However, the present disclosure is not limited to the following exemplary embodiments but may be implemented in various different forms. The exemplary embodiments are provided only to complete disclosure of the present disclosure and to fully provide a person having ordinary skill in the art to which the present disclosure pertains with the category of the disclosure, and the present disclosure will be defined by the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the present specification. Further, in the following description, a detailed explanation of well-known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is referred to as being "on" another element or layer, it may be directly on the other element or layer, or intervening elements or layers may be present.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Throughout the whole specification, the same reference numerals denote the same elements.

Since the size and thickness of each component illustrated in the drawings are represented for convenience in explanation, the present disclosure is not necessarily limited to the illustrated size and thickness of each component.

The features of various exemplary embodiments of the present disclosure can be partially or entirely bonded to or combined with each other and can be interlocked and operated in technically various ways as can be fully understood by a person having ordinary skill in the art, and the various exemplary embodiments can be carried out independently of or in association with each other.

Figure 2:
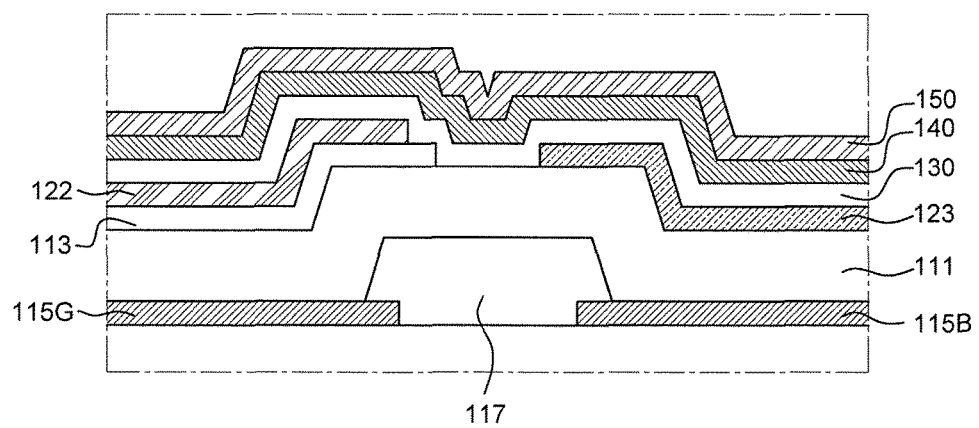
FIG. 2 is a diagram schematically enlarging a part of an organic light emitting display device according to an exemplary embodiment of the present disclosure.

FIG. 1 is a diagram schematically illustrating an organic light emitting display device, and FIG. 2 is a diagram schematically enlarging a part of an organic light emitting display device according to an exemplary embodiment of the present disclosure.

Referring to FIG. 1 and FIG. 2, sub-pixels of an organic light emitting display device 100 according to an exemplary embodiment of the present disclosure include a red sub-pixel, a green sub-pixel, and a blue sub-pixel capable of displaying three primary colors.

Each sub-pixel of the organic light emitting display device 100 includes an organic light emitting diode (OLED), a thin film transistor that drives the OLED, and a capacitor that stores an image signal. The sub-pixels of the organic light emitting display device are disposed in a matrix to display an image. Further, at least data lines, gate lines, and VDD lines are formed in order to drive a plurality of pixels. In the organic light emitting display device 100, a plurality of sub-pixels and lines are formed on a glass, plastic, or metal substrate. The OLED may be formed on an overcoating layer that covers the thin film transistor formed on the substrate, but is not limited thereto.

The red sub-pixel includes a red OLED, and is connected to a capacitor and a driving transistor that drives the red OLED. The green sub-pixel includes a green OLED, and is connected to a capacitor and a driving transistor that drives the green OLED. The blue sub-pixel includes a blue OLED, and is connected to a capacitor and a driving transistor that drives the blue OLED.

The red OLED is configured to emit a red light. The red OLED has a structure in which a first anode electrode 115R, a third hole transporting layer 111, a first hole transporting layer 112, a red organic emission layer 121, an electron transporting layer 130, a translucent cathode electrode 140, and a capping layer 150 are laminated in sequence. In accordance with the light emission type of the OLED, a reflective anode electrode and a translucent cathode electrode for a top emission type OLED can be replaced with a reflective cathode and a translucent anode for a bottom emission type OLED.

The green OLED is configured to emit a green light. The green OLED has a structure in which a second anode electrode 115G, the third hole transporting layer 111, a second hole transporting layer 113, a green organic emission layer 122, the electron transporting layer 130, the translucent cathode electrode 140, and the capping layer 150 are laminated in sequence.

The blue OLED is configured to emit a blue light. The blue OLED has a structure in which a third anode electrode 115B, the third hole transporting layer 111, a blue organic emission layer 123, the electron transporting layer 130, the translucent cathode electrode 140, and the capping layer 150 are laminated in sequence.

Each of the anode electrodes 115R, 115G, and 115B is configured to have reflection characteristics. Specifically, each of the anode electrodes 115R, 115G, and 115B is configured as a reflective electrode and the cathode electrode 140 is configured as a transflective electrode so as to form a micro cavity in order to increase the color purity of the OLEDs and the brightness at a front viewing angle. The micro cavity refers to a structure having an optical distance that can increase the brightness in a specific visible light wavelength band (constructive interference) and decrease the brightness in the other visible light wavelength bands (destructive interference) by adjusting a distance between the reflective electrode (anode electrode) and the transflective electrode (cathode electrode). However, in case a microcavity is not used, transparent electrodes can be used instead of the reflective electrode and the translucent electrode.

The reflection characteristics of the anode electrodes are realized using a metallic material (for example, silver (Ag) or APC) having a high reflectance in a visible light wavelength band, but is not limited thereto. The transflective characteristics of the cathode electrode 140 are realized using a metallic material (for example, magnesium:silver (Mg:Ag) with a thickness of 150 Å to 250 Å) which can be transflective in the form of thin film with a transmittance of 35% to 45% in a visible light wavelength band, but is not limited thereto.

A white light may be a mixture of a red light, a green light, and a blue light. The white light may be generated by applying signals suitable for displaying a white light to the red OLED, the green OLED, and the blue OLED. For example, the white light may be generated when a red image signal, a green image signal and a blue image signal each having the maximum gray level are applied to the red, green and blue OLEDs, respectively. Otherwise, in case of measuring a white light having a low gray level, the white light may be generated when a red image signal, a green image signal and a blue image signal each having a gray level of 31 are applied to the red, green and blue OLEDs, respectively, but is not limited thereto.

A white balance value of the white light may be measured as a value of CIELu'v', and can be expressed as a color temperature. In general, as a white light is closer to blue, a color temperature is increased, and as a white light is closer to red, a color temperature is decreased.

The red organic emission layer 121 has a photoluminescence spectrum resulting from a host and/or a dopant material included in the red organic emission layer 121. Further, a wavelength having the highest intensity in the photoluminescence spectrum of the red organic emission layer 121 is defined as a photoluminescence peak of the red organic emission layer 121.

The green organic emission layer 122 has a photoluminescence spectrum resulting from a host and/or a dopant material included in the green organic emission layer 122. Further, a wavelength having the highest intensity in the photoluminescence spectrum of the green organic emission layer 122 is defined as a photoluminescence peak of the green organic emission layer 122.

The blue organic emission layer 123 has a photoluminescence spectrum resulting from a host and/or a dopant material included in the blue organic emission layer 123. Further, a wavelength having the highest intensity in the photoluminescence spectrum of the blue organic emission layer 123 is defined as a photoluminescence peak of the blue organic emission layer 123.

Each of the OLEDs has an optical distance. For example, an optical distance of the red OLED is defined by a distance between a top surface of the first anode electrode 115R and a bottom surface of the translucent cathode electrode 140. An optical distance of the green OLED is defined by a distance between a top surface of the second anode electrode 115G and the bottom surface of the translucent cathode electrode 140. An optical distance of the blue OLED is defined by a distance between a top surface of the third anode electrode 115B and the bottom surface of the translucent cathode electrode 140.

That is, the distance between the top surface of the first anode electrode 115R and the bottom surface of the translucent cathode electrode 140 may be a first optical distance. Further, the distance between the top surface of the second anode electrode 115G and the bottom surface of the translucent cathode electrode 140 may be a second optical distance. Furthermore, the distance between the top surface of the third anode electrode 115B and the bottom surface of the translucent cathode electrode 140 may be a third optical distance. In each of the optical distances, a micro cavity capable of amplifying an electroluminescence peak wavelength of the organic emission layer corresponding thereto is formed.

An optical distance of each of the OLEDs may be adjusted by at least one hole transporting layer. For example, the optical distance of the red OLED may be adjusted by the first hole transporting layer 112. For example, the optical distance of the green OLED may be adjusted by the second hole transporting layer 113. For example, the optical distance of the blue OLED may be adjusted by the third hole transporting layer 111. However, the present disclosure is not limited thereto. An optical distance can be adjusted by at least another one of the laminated layers.

If a thickness of a common layer is changed, all the optical distances of the red OLED, the green OLED, and the blue OLED are changed. The common layer refers to a layer commonly included in the red OLED, the green OLED, and the blue OLED.

As a thickness of the common layer is increased, a moving distance of a hole is increased. A hole has a specific mobility. A position where an electron and a hole are combined to form an exciton may be determined according to a mobility and a moving distance of the hole and a mobility and a moving distance of the electron. The exciton is formed in an organic emission layer to enable an OLED to emit a light, but is not limited thereto.

For example, the third hole transporting layer 111 is a common layer. Thus, if a thickness of the third hole transporting layer 111 is adjusted, the optical distance of the red OLED, the optical distance of the green OLED, and the moving distance of the hole may be changed. In this case, the optical distances and the moving distance of the hole can be adjusted by adjusting thicknesses of the first hole transporting layer 112 and the second hole transporting layer 113. Each of the OLEDs has an electroluminescence spectrum which can be determined by an effect of a micro cavity depending on an optical distance. That is, a photoluminescence spectrum emitted from an organic emission layer and an electroluminescence spectrum emitted from an OLED are different from each other.

A wavelength having the highest intensity in the electroluminescence spectrum of the red OLED is defined as an electroluminescence peak of the red OLED. A wavelength having the highest intensity in the electroluminescence spectrum of the green OLED is defined as an electroluminescence peak of the green OLED. A wavelength having the highest intensity in the electroluminescence spectrum of the blue OLED is defined as an electroluminescence peak of the blue OLED.

In the organic light emitting display device 100 according to an exemplary embodiment of the present disclosure, the first anode electrode 115R, the second anode electrode 115G, and the third anode electrode 115B are patterned to be spaced away from each other. Further, a bank 117 is disposed to cover edges of the first anode electrode 115R, the second anode electrode 115G, and the third anode electrode 115B. The third hole transporting layer 111 is disposed on the first anode electrode 115R, the second anode electrode 115G, and the third anode electrode 115B, and the bank 117 and configured to have a third hole mobility. That is, the third hole transporting layer 111 may be configured as a common layer to be connected to all of the OLEDs, but is not limited thereto.

The organic light emitting display device 100 according to an exemplary embodiment of the present disclosure includes the first hole transporting layer 112 disposed on the third hole transporting layer 111 and configured to have a first hole mobility higher than the third hole mobility. The first hole transporting layer 112 is configured to have a predetermined optical distance to form a micro cavity of the red OLED.

The second hole transporting layer 113 is disposed on the third hole transporting layer 111 and configured to have a second hole mobility higher than the third hole mobility. The second hole transporting layer 113 is configured to have a predetermined optical distance to form a micro cavity of the green OLED. Further, the first hole mobility and the second hole mobility may be identical to or different from each other.

The first hole mobility of the first hole transporting layer 112 and the second hole mobility of the second hole transporting layer 113 are higher than the third hole mobility of the third hole transporting layer 111. Thus, even if the thickness of the first hole transporting layer 112 and/or the second hole transporting layer 113 is increased, a hole can move rapidly in the first hole transporting layer 112 and the second hole transporting layer 113. Therefore, a change in characteristic caused by an increase in optical distance of the red OLED and the green OLED can be minimized.

That is, even if the thickness of the first hole transporting layer 112 is increased, since the first hole mobility of the first hole transporting layer 112 and the second hole mobility are higher than the third hole mobility, a difference in electron migration time between the red OLED and the blue OLED caused by an increase in thickness can be minimized.

Further, a hole mobility of the third hole transporting layer can be set to be low. Thus, a variance in white balance of a white light depending on a temperature can be reduced. Therefore, even if a temperature is changed, a change in image quality can be reduced. The first hole transporting layer 112 is disposed on the first anode electrode 115R and the second hole transporting layer 113 is disposed on the second anode electrode 115G. The first hole transporting layer 112 and the second hole transporting layer 113 may be configured so as not to be overlapped with each other and may be insulated from each other. Therefore, there is an advantage in that the first hole transporting layer 112 and the second hole transporting layer 113 do not transfer a lateral current to each other.

The red organic emission layer 121 is overlapped with the first anode electrode 115R and disposed on the first hole transporting layer 112. The green organic emission layer 122 is overlapped with the second anode electrode 115G and disposed on the second hole transporting layer 113. Further, the blue organic emission layer 123 is overlapped with the third anode electrode 115B and disposed on the third hole transporting layer 111.

If the third hole mobility of the third hole transporting layer 111 is high, a variance in lateral current depending on a temperature may be increased. Therefore, the hole mobility of the third hole transporting layer 111 is set to be low. That is, if the hole mobility is low, as a temperature is increased, a variance in conductivity may be decreased. Therefore, a difference in amount of lateral current depending on a temperature can be reduced. Further, the third hole mobility of the third hole transporting layer 111 may be higher than hole mobilities of the red organic emission layer 121, the green organic emission layer 122, and the blue organic emission layer 123. According to the above-described configuration, the hole mobility in an organic emission layer is relatively decreased as compared with an electron transporting layer. Thus, a retention time of a hole in the organic emission layer may be increased. Therefore, an electron and a hole may be combined in the organic emission layer to form an exciton.

The electron transporting layer 130 is disposed on the red organic emission layer 121, the green organic emission layer 122, and the blue organic emission layer 123. The translucent cathode electrode 140 is disposed on the electron transporting layer 130. Further, the capping layer 150 is disposed on the translucent cathode electrode 140.

The third hole mobility is characterized by being higher than a hole mobility of the electron transporting layer 130. For example, the third hole mobility of the third hole transporting layer 111 may be in the range of $10^{-10}$ ($m^2V^{-1}s^{-1}$) to $10^{-3}$ ($m^2V^{-1}s^{-1}$). Further, a hole mobility of each of the other relevant layers in the organic light emitting display device 100 may be determined on the basis of the third hole mobility.

The first hole transporting layer 112 is configured to have a first thickness. The second hole transporting layer 113 is configured to have a second thickness. The third hole transporting layer 111 is configured to have a third thickness. The third thickness is set to be greater than the first thickness. The first thickness is set to be greater than the second thickness.

The red OLED and the green OLED have the longer optical distances than the blue OLED. Thus, the hole mobilities of the first hole transporting layer 112 and the second hole transporting layer 113 need to be higher than the hole mobility of the third hole transporting layer 111 in order to keep a balance.

For example, the third thickness may be set in the range of 500 Å to 1500 Å. Further, more preferably, the third thickness may be set in the range of 900 Å to 1200 Å, but is not limited thereto. For example, the sum of the thicknesses of the first hole transporting layer 112 and the third hole transporting layer 111 disposed on the first anode electrode 115R may be set to 3500 Å or less, but is not limited thereto.

FIG. 3 is a table comparing an organic light emitting display device according to an exemplary embodiment of the present disclosure with Comparative Example.

Referring to FIG. 3, the hole mobility of the third hole transporting layer 111 of the organic light emitting display device according to an exemplary embodiment of the present disclosure is lower than a hole mobility of a third hole transporting layer according to Comparative Example. FIG. 3 shows the measurement results measured at room temperature. By comparison of the measurement results measured at room temperature, there is substantially no difference in driving voltage (V) and panel efficiency (cd/A) between red OLEDs, between green OLEDs, and between blue OLEDs. Therefore, it is confirmed that there is little difference in electrical characteristic and efficiency depending on a hole mobility.

Figure 4:
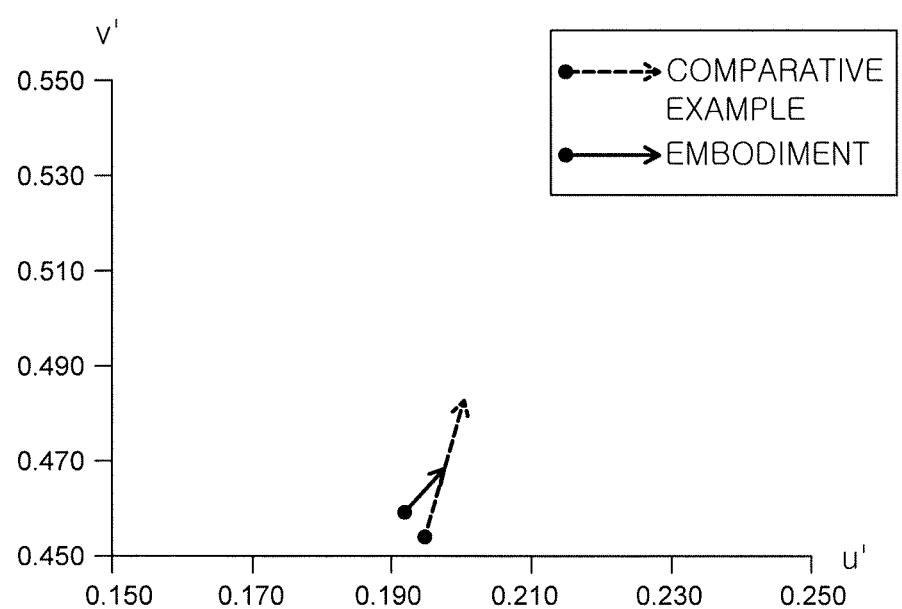
FIG. 4 is a graph comparing color coordinates of a white balance depending on a temperature between an organic light emitting display device according to an exemplary embodiment of the present disclosure and Comparative Example.

FIG. 4 is a graph comparing color coordinates of a white balance depending on a temperature between an organic light emitting display device according to an exemplary embodiment of the present disclosure and Comparative Example.

FIG. 4 illustrates the measurement results measured at a viewing angle of 0° (measured in front). However, the present disclosure is not limited thereto. The measurement may be conducted at a different angle, for example, 10°. A reference angle is regarded as 0° unless a measurement angle is specifically indicated otherwise.

In FIG. 4, the X-axis represents a value of u' in CIELu'v' color space coordinates. Further, the Y-axis represents a value of v' in the CIELu'v' color space coordinates. The measurement result of Comparative Example is indicated by a dotted line arrow. The measurement result of the organic light emitting display device according to an exemplary embodiment of the present disclosure is indicated by a solid line arrow. A starting point of each arrow indicates the measured color coordinates (u'v') of a white light (white balance) having a gray level of 31 measured at −20° C. An end point of each arrow indicates the measured color coordinates (u'v') of the white light having a gray level of 31 measured at 70° C. It can be seen that as the temperature is increased, the values of the color coordinates are increased. Further, it can be seen that Comparative Example has a greater color-coordinate difference (Δu'v') of a white balance.

Figure 5:
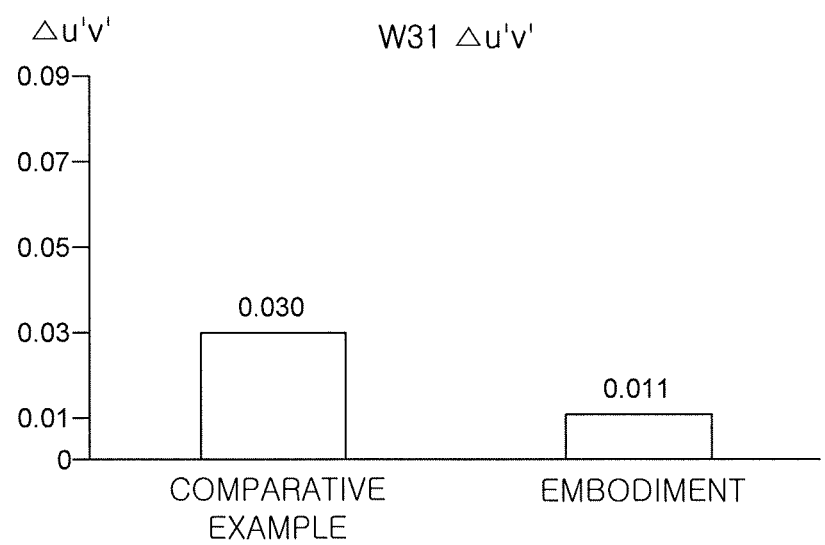
FIG. 5 is a graph comparing a color-coordinate difference of a white balance depending on a temperature between an organic light emitting display device according to an exemplary embodiment of the present disclosure and Comparative Example.

FIG. 5 is a graph comparing a color-coordinate difference of a white balance depending on a temperature between an organic light emitting display device according to an exemplary embodiment of the present disclosure and Comparative Example.

In FIG. 5, the Y-axis represents color-coordinate differences (Δu'v') of the respective arrows illustrated in FIG. 4. Referring to FIG. 4 and FIG. 5, in the organic light emitting display device 100 according to an exemplary embodiment of the present disclosure, when a white light having a gray level of 31 was measured at −20° C. and 70° C., a color-coordinate difference (Δu'v') was 0.011. Further, in Comparative Example, when the measurement was conducted under the same conditions, a color-coordinate difference (Δu'v') was 0.030.

That is, it can be seen that a color-coordinate difference (Δu'v') depending on a temperature can be reduced by reducing a hole mobility of the third hole transporting layer 111 of the organic light emitting display device 100.

An organic light emitting display device according to some exemplary embodiments may further include a p-doped hole transporting layer or hole injection layer on a bottom surface of the third hole transporting layer 111. According to the above-described configuration, the driving voltage of the organic light emitting display device 100 can be reduced. However, the present disclosure is not limited thereto.

The exemplary embodiments of the present disclosure can also be described as follows:

According to exemplary embodiments of the present disclosure, there is provided an organic light emitting display device. The organic light emitting display device includes: a first anode electrode, a second anode electrode, and a third anode electrode which are patterned as being laterally spaced apart from each other; a bank configured to cover edges of the first anode electrode, the second anode electrode, and the third anode electrode; a third hole transporting layer disposed on the first to third anode electrodes and the bank, and configured to have a third hole mobility; a first hole transporting layer disposed on the third hole transporting layer and configured to have a first hole mobility higher than the third hole mobility; and a second hole transporting layer disposed next to the first hole transporting layer on the third hole transporting layer and configured to have a second hole mobility higher than the third hole mobility.

The first hole transporting layer may be disposed on the first anode electrode, and the second hole transporting layer may be disposed on the second anode electrode.

In the organic light emitting display device according to the present disclosure, the first hole transporting layer and the second hole transporting layer may be configured so as not to be overlapped with each other.

The organic light emitting display device according to the present disclosure may further include: a red organic emission layer disposed on the first anode electrode and the first hole transporting layer; a green organic emission layer overlapped with the second anode electrode and disposed on the second hole transporting layer; and a blue organic emission layer overlapped with the third anode electrode and disposed on the third hole transporting layer.

The third hole mobility may be higher than hole mobilities of the red organic emission layer, the green organic emission layer, and the blue organic emission layer.

The organic light emitting display device according to the present disclosure may further include: an electron transporting layer disposed on the red organic emission layer, the green organic emission layer, and the blue organic emission layer.

The organic light emitting display device according to the present disclosure may further include: a translucent cathode electrode disposed on the electron transporting layer; and a capping layer disposed on the translucent cathode electrode.

The third hole mobility may be higher than a hole mobility of the electron transporting layer.

The third hole mobility of the third hole transporting layer may be in the range of $10^{-10}$ $(m^2V^{-1}s^{-1})$ to $10^{-3}$ $(m^2V^{-1}s^{-1})$.

The first hole transporting layer may be configured to have a first thickness. The second hole transporting layer may be configured to have a second thickness. The third hole transporting layer may be configured to have a third thickness.

The third thickness may be greater than the first thickness.

The first thickness may be greater than the second thickness.

The third thickness may be in the range of 500 Å to 1500 Å.

The sum of thicknesses of the first hole transporting layer and the third hole transporting layer disposed on the first anode electrode may be 3500 Å or less.

A distance between a top surface of the first anode electrode and a bottom surface of the translucent cathode electrode may be a first optical distance. A distance between a top surface of the second anode electrode and the bottom surface of the translucent cathode electrode may be a second optical distance. A distance between a top surface of the third anode electrode and the bottom surface of the translucent cathode electrode may be a third optical distance. A micro cavity capable of amplifying an electroluminescence peak wavelength of the organic emission layer corresponding to each of the optical distances may be formed.

According to other exemplary embodiments of the present disclosure, there is provided an organic light emitting display device. The organic light emitting display device includes: a first anode electrode, a second anode electrode, and a third anode electrode, each anode electrode being spaced apart from each other; a first hole transporting layer disposed on the first, second, and third anode electrodes and having a first hole mobility; a second hole transporting layer disposed on the first hole transporting layer and having a second hole mobility; and a third hole transporting layer disposed next to the second hole transporting layer on the first hole transporting layer and having a third hole mobility. Each of the second hole mobility and the third hole mobility is higher than the first hole mobility.

A bank may be disposed on edges of the first anode electrode, the second anode electrode, and the third anode electrode. The second hole transporting layer may be spaced apart from the third hole transporting layer on an area overlapped with the bank and may be insulated from the third hole transporting layer.

According to other exemplary embodiments of the present disclosure, there is provided an apparatus. The apparatus includes: a substrate with organic light emitting layers for a matrix of pixels in a display area; and a third hole transporting layer configured as a common layer across the entirety of the display area, and configured to control an amount of lateral current in the common layer to minimize a color coordinate difference with respect to white balance characteristics of white light emitted from the organic light emitting layers, such that white balance variations due to ambient temperature are suppressed.

With respect to each pixel having at least a first sub-pixel, a second sub-pixel, and a third sub-pixel, a hole transporting layer comprises the third a hole transporting layer located on and spanning across a first anode, a second anode, and a third anode of the first, second, and third sub-pixels, respectively, a first a hole transporting layer stacked on the third a hole transporting layer over the first anode, and a second a hole transporting layer stacked on the third a hole transporting layer over the second anode. A hole mobility of the first a hole transporting layer is higher than a hole mobility of the third a hole transporting layer, and a hole mobility of the second a hole transporting layer is higher than the hole mobility of the third a hole transporting layer.

According to other exemplary embodiments of the present disclosure, there is provided a method for forming an organic light emitting display device. The method includes: forming a first anode electrode, a second anode electrode, and a third anode electrode, each anode electrode being laterally spaced apart from each other; forming a bank on edges of the first, second, and third anode electrodes; forming a first hole transporting layer on the first to third anode electrodes and the bank, the first hole transporting layer having a first hole mobility; forming a second hole transporting layer on the first hole transporting layer, the second hole transporting layer having a second hole mobility higher than the first hole mobility; and forming a third hole transporting layer next to the second hole transporting layer on the first hole transporting layer, the third hole transporting layer having a third hole mobility higher than the first hole mobility.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. An organic light emitting display device comprising:
   a first anode electrode, a second anode electrode, and a third anode electrode, each anode electrode being laterally spaced apart from each other;
   a third hole transporting layer disposed on the first anode electrode, the second anode electrode, and the third anode electrode, and having a third hole mobility;
   a first hole transporting layer disposed on the third hole transporting layer and having a first hole mobility; and
   a second hole transporting layer disposed next to the first hole transporting layer on the third hole transporting layer and having a second hole mobility,
   wherein a thickness of the third hole transporting layer is greater than a thickness of the first hole transporting layer, and
   wherein the third hole mobility of the third hole transporting layer is lower than the first hole mobility of the first hole transporting layer and the second hole mobility of the second hole transporting layer to reduce a lateral current between the first, second and third hole transporting layers.

2. The organic light emitting display device according to claim 1, wherein the first hole transporting layer is disposed on the first anode electrode, and the second hole transporting layer is disposed on the second anode electrode.

3. The organic light emitting display device according to claim 2, wherein the first hole transporting layer and the second hole transporting layer are disposed not to be overlapped with each other.

4. The organic light emitting display device according to claim 2, further comprising:
   a red organic emission layer disposed on the first anode electrode and the first hole transporting layer;
   a green organic emission layer overlapped with the second anode electrode and disposed on the second hole transporting layer; and
   a blue organic emission layer overlapped with the third anode electrode and disposed on the third hole transporting layer.

5. The organic light emitting display device according to claim 4, wherein the third hole mobility is higher than hole mobilities of the red organic emission layer, the green organic emission layer, and the blue organic emission layer.

6. The organic light emitting display device according to claim 4, further comprising:
an electron transporting layer disposed on the red organic emission layer, the green organic emission layer, and the blue organic emission layer, respectively.

7. The organic light emitting display device according to claim 6, further comprising:
a translucent cathode electrode disposed on the electron transporting layer; and
a capping layer disposed on the translucent cathode electrode.

8. The organic light emitting display device according to claim 6, wherein the third hole mobility is higher than a hole mobility of the electron transporting layer.

9. The organic light emitting display device according to claim 1, wherein the third hole mobility of the third hole transporting layer is in the range of $10^{-10}$ $(m^2V^{-1}s^{-1})$ to $10^{-3}$ $(m^2V^{-1}s^{-1})$.

10. The organic light emitting display device according to claim 1, wherein the thickness of the first hole transporting layer is greater than a thickness of the second hole transporting layer.

11. The organic light emitting display device according to claim 1, wherein the thickness of the third hole transporting layer is in the range of 500 Å to 1500 Å.

12. The organic light emitting display device according to claim 11, wherein a sum of the thicknesses of the first hole transporting layer and the third hole transporting layer disposed on the first anode electrode is 3500 Å or less.

13. The organic light emitting display device according to claim 7, wherein a distance between a top surface of the first anode electrode and a bottom surface of the translucent cathode electrode is a first optical distance,
a distance between a top surface of the second anode electrode and the bottom surface of the translucent cathode electrode is a second optical distance, and
a distance between a top surface of the third anode electrode and the bottom surface of the translucent cathode electrode is a third optical distance.

14. The organic light emitting display device according to claim 1, further comprising:
a bank disposed on edges of the first anode electrode, the second anode electrode, and the third anode electrode.

15. The organic light emitting display device according to claim 14, wherein the second hole transporting layer is spaced apart from the first hole transporting layer disposed on an area overlapped with the bank and is insulated from the first hole transporting layer.

16. The organic light emitting display device according to claim 1, wherein the first hole transporting layer is entirely overlapped with the third hole transporting layer, and the second hole transporting layer is entirely overlapped with the third hole transporting layer.

17. The organic light emitting display device according to claim 1, wherein the first hole transporting layer is stacked on the third hole transporting layer, and the second hole transporting layer is stacked on the third hole transporting layer.

18. The organic light emitting display device according to claim 17, wherein the third hole transporting layer is disposed between the first anode electrode and the first hole transporting layer, and between the second anode electrode and the second hole transporting layer.

19. The organic light emitting display device according to claim 18, wherein the thickness of the third hole transporting layer is at least 500 Å.

20. The organic light emitting display device according to claim 18, wherein the thickness of the third hole transporting layer is in a range of 1200 Å to 1500 Å.

* * * * *